United States Patent
Wang et al.

(10) Patent No.: US 7,857,485 B2
(45) Date of Patent: Dec. 28, 2010

(54) PHOSPHOR-BASED LED APPARATUS WITH UV REFLECTOR

(75) Inventors: Jih-Fu Trevor Wang, Changhua County (TW); Jim-Yong Chi, Taichung (TW); Chiu-Ling Chen, Hsinchu County (TW); I-Min Chan, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 784 days.

(21) Appl. No.: 11/679,127

(22) Filed: Feb. 26, 2007

(65) Prior Publication Data

US 2008/0068821 A1    Mar. 20, 2008

(30) Foreign Application Priority Data

Sep. 14, 2006    (TW) ............................. 95133977 A

(51) Int. Cl.
  *H01J 63/06*    (2006.01)
  *F21V 9/16*    (2006.01)
(52) U.S. Cl. .................. 362/293; 362/84; 362/612; 362/249.02; 362/97.2; 257/98; 313/502
(58) Field of Classification Search .................. 362/84, 362/293, 97.2, 612, 249.02; 257/98; 313/502
See application file for complete search history.

(56) References Cited

U.S. PATENT DOCUMENTS 4,254,453 A * 3/1981 Mouyard et al. ............ 362/240

(Continued)

FOREIGN PATENT DOCUMENTS

CN    1121618    5/1996

(Continued)

*Primary Examiner*—Ismael Negron
(74) *Attorney, Agent, or Firm*—Jianq Chyun IP Office

(57) ABSTRACT

A light emitting apparatus at least includes a light emitting device, a connecting wire structure, and a space-occupation body. The light emitting device is disposed in the space-occupation body, electrically coupled with the connecting wire structure, and emits a first-frequency-range light under a suitable driving voltage. A light emitting surface of the light emitting device structure is covered by a first anti-reflection layer with respect to the first-frequency-range light. A packaging material is filled into the space-occupation body. The packaging material at least includes a luminescent material. The luminescent material is excited by the first-frequency-range light, so as to generate at least a second-frequency-range light. A reflector is disposed on the light emitting surface of the light emitting apparatus, such that the first-frequency-range light is totally or mostly reflected back to the space-occupation body omni-directionally, and the excited second-frequency-range light passes through the reflector.

18 Claims, 4 Drawing Sheets

U.S. PATENT DOCUMENTS

| | | | |
|---|---|---|---|
| 4,970,812 A * | 11/1990 | Tanaka et al. | 40/452 |
| 5,136,483 A * | 8/1992 | Schoniger et al. | 362/545 |
| 5,779,351 A * | 7/1998 | Erickson et al. | 362/241 |
| 5,813,753 A * | 9/1998 | Vriens et al. | 362/293 |
| 5,962,971 A * | 10/1999 | Chen | 313/512 |
| 6,036,328 A * | 3/2000 | Ohtsuki et al. | 362/612 |
| 6,422,716 B2 * | 7/2002 | Henrici et al. | 362/235 |
| 6,508,564 B1 * | 1/2003 | Kuwabara et al. | 362/612 |
| 6,682,207 B2 | 1/2004 | Weber et al. | |
| 6,833,565 B2 | 12/2004 | Su et al. | |
| 7,083,302 B2 * | 8/2006 | Chen et al. | 362/231 |
| 2002/0084749 A1 * | 7/2002 | Ayala et al. | 313/512 |
| 2002/0180351 A1 * | 12/2002 | McNulty et al. | 313/512 |
| 2007/0064407 A1 * | 3/2007 | Huang et al. | 362/19 |

FOREIGN PATENT DOCUMENTS

| | | |
|---|---|---|
| CN | 1584957 | 2/2005 |
| CN | 1805158 | 7/2006 |

* cited by examiner

PHOSPHOR-BASED LED APPARATUS WITH UV REFLECTOR

CROSS-REFERENCE TO RELATED APPLICATION

This application claims the priority benefit of Taiwan application serial no. 95133977, filed on Sep. 14, 2006. All disclosure of the Taiwan application is incorporated herein by reference.

BACKGROUND OF THE INVENTION

1. Field of Invention

The present invention relates to a light emitting apparatus. More particularly, the present invention relates to a light emitting apparatus capable of improving output light efficiency, for example, a green light emitting apparatus.

2. Description of Related Art

Recently, solid organic and inorganic light emitting devices, for example, the devices for generating light source, are widely applied. However, the light output efficiency of the light emitting device is one of the important parameters determining the quality thereof. For an inorganic solid light source, for example, GaN based light emitting diode (LED) has the luminescent material such as AlGaInN or InGaN. In general, the light emitting wavelength range of the solid inorganic LED is between 400 nm and 600 nm. However, when the wavelength range is between 525 nm and 575 nm (green light), the light emitting efficiency is sharply reduced. Therefore, the output light emitting efficiency of the conventional inorganic green light LED without luminescent powder is quite low.

In order to have higher green output light emitting efficiency, in the conventional manner, inorganic UV LED or inorganic blue LED is used to excite high efficient green light luminescent powder to generate green light. FIG. 1 is a schematic cross sectional view of the conventional inorganic UV or Blue LED with green luminescent powder. Referring to FIG. 1, a structural body 100 has a conducting wire structure 112, an LED device 105 and an encapsulating body. The conducting wire structure includes, for example, a n pad conducting wire 102 and a p pad conducting wire 104. The LED device 105 is disposed in the encapsulating body of the structural body 100, and electrically coupled with the n pad conducting wire 102 and the p pad conducting wire 104. For example, LED device 105 may emit UV light or blue light under suitable applied voltage. The structure of the conventional inorganic LED device 105 includes at least a n-type semiconductor layer 106, a p-type semiconductor layer 108, and a light emitting active layer between the two semiconductor layers. The p-type semiconductor layer 108 is connected to the p pad conducting wire 104 by an electrode layer 110 and a wire 112. When an operating voltage is applied to the LED device 105, for example, UV light or blue light may be emitted from each direction, as shown by the arrows. Further, an encapsulating layer 114, such as epoxy, fills into the encapsulating body of the structural body 100. The green luminescent powder 116 is distributed over inside the encapsulating body 114.

The UV light or the blue light emitted by the LED 105 can excite the green luminescent powder 116 to generate green light. In single exciting process on the green luminescent powder, the green light conversion is not 100%. The disadvantages of the above-mentioned approaches lie in the facts that are the UV light left uncoverted is not recycled to excite the luminescent powder again and thus is converted into green light, and light absorption loss of UV light or of blue light due to total internal reflection and Fresnel reflection loss is not reduced or eliminated. Therefore, the green light output efficiency becomes seriously low. Further, in order to let the green light emit in a direction range efficiently, a reflector 118 may also be disposed at the inner peripheral of the encapsulating body.

The conventional light emitting apparatus as shown in FIG. 1 may effectively generate green light, but the light extraction efficiency requires further improvement. Currently the manufacturers still continue to develop new technology to improve the output light efficiency.

SUMMARY OF THE INVENTION

Accordingly, the present invention is related to a light emitting apparatus design, which is capable of effectively improving the output light efficiency of the light emitting apparatus, and is not limited to green light emitting apparatus, however, the other wavelengths are also applicable.

The present invention provides a light emitting apparatus, which at least comprises a light emitting device structure, a conducting wire structure and an encapsulating body. The light emitting device structure is disposed inside the encapsulating body, electrically coupled with the conducting wire structure, and emits a first frequency range light once a suitably applied voltage on the conducting wire is on. The light emitting surface of the light emitting device structure is covered by a first dielectric layer, which can transmit light at the first frequency range. A luminescent material fills into the encapsulating body and is distributed over inside of the encapsulating body, and the luminescent material can be excited by light at the first frequency range to generate at least light at a second frequency rang, so as to emit a mixed light (at least comprising a first and a second frequency light or monochromatic light (comprising the second frequency light).

In the light emitting apparatus according to an embodiment of the present invention, for example, the first frequency ranged light is UV or blue, and the mixed light is visible In the light emitting apparatus according to an embodiment of the present invention, for example, the first dielectric layer is a film having a reducing refractivity, or a medium film having a density decreasing along with the depth toward the interface of low index of refraction.

In the light emitting apparatus according to an embodiment of the present invention, light emitting apparatus comprises a dielectric reflector located on the light emitting surface of the encapsulating body. The dielectric reflector substantially omni-directionally reflects the first high frequency ranged light, but allows lower frequency light to pass.

In the light emitting apparatus according to an embodiment of the present invention, the light emitting apparatus comprises a second dielectric layer which can transmit the generated light, disposed on the first dielectric reflector, so as to reduce total internal reflection of the generated light at the light emitting interface.

In the light emitting apparatus according to an embodiment of the present invention, the luminescent material inside the encapsulating body is, for example, luminescent powder, quantum dot, or organic luminescent material.

The present invention provides a planar light emitting source apparatus, which comprises at least one light guide plate, and a plurality of light emitting apparatuses as described above, wherein the light emitting apparatus are disposed at the inner peripheral of the light guide plate, the back surface of the light guide plate is reflective, and thus light is emitted from the front surface of the light guide plate.

The present invention further provides a flat panel display comprising at least one light emitting apparatus as described above, wherein the light emitting apparatus are spatially arranged as a two-dimensional array, and has an electrical driving circuit to drive the light emitting apparatus to emit visible light to distribute on the light emitting surface of said display according to input signals.

In the embodiment of the present invention, as a first dielectric layer capable of transmitting light at the first frequency range highly covering on the light emitting surface of the light emitting device structure is used, the first frequency ranged light emitted by the light emitting device structure can reduce or eliminate total internal reflection (TIR) or Fresnel reflection loss at the air-encapsulating body interface when the incident angle of light emission is bigger than a critical angle. Further, a second dielectric layer capable of transmitting the second frequency light highly is disposed at the air-encapsulating body interface, such that most of generated light can be emitted successfully to reduce or eliminate the reflection.

In order to the make aforementioned features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute part of this specification. The drawings illustrate embodiments of the invention and, together with the description, serve to explain the principles of the invention.

DESCRIPTION OF EMBODIMENTS

Figure 1:
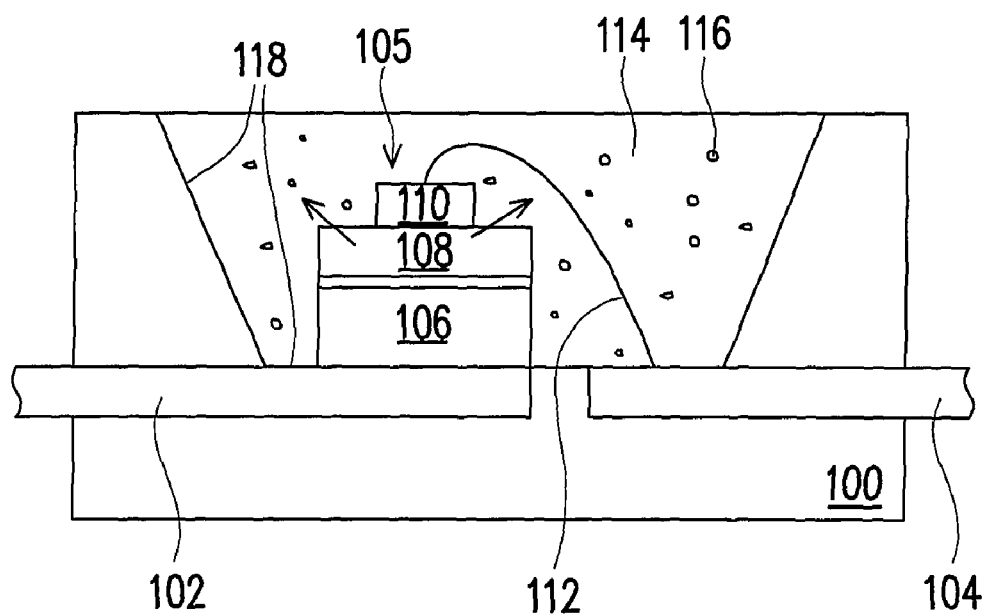
FIG. 1 is a schematic cross-sectional view of the conventional green light emitting apparatus with green luminescent powder.

In the present invention, following the further investigation of the conventional LED structure of FIG. 1, it is found that the conventional LED structure still has several disadvantages. The refractivity of the semiconductor layers 106, 108 GaN is about n=2.4, and the refractivity of the encapsulating layer 114 (for example epoxy) is about n=1.5. According to optics principle, the light emitted by the LED device 105, for example UV light or blue light, may suffer total internal reflection (TIR) at the interface. In this manner, part of the light emitted by the LED device 105 is then reflected back to the LED device 105 and not effectively used, eventually absorbed by the LED device material 105 to convert into heat, resulting in the shorter operation lifetime of the LED device 100. Further, the generated green light suffers total internal reflection at the air-encapsulating body interface, thus reducing green light output efficiency.

The present invention provides a new light emitting apparatus design following the investigation of the conventional art, it is not limited to green light, the other wavelengths are applicable, and the output light efficiency of the LED apparatus is improved. Some embodiments are illustrated as examples, but the present invention is not limited to the illustrated embodiments.

Figure 2:
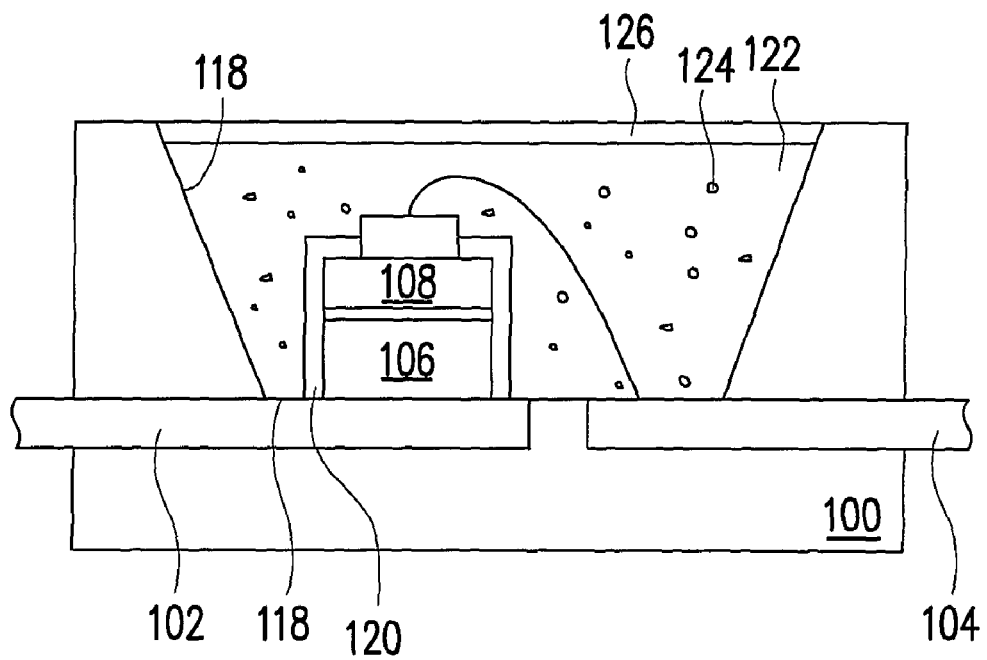
FIG. 2 is a schematic cross-sectional view of the light emitting apparatus according to an embodiment of the present invention.

FIG. 2 is a schematic cross sectional view of the light emitting apparatus according to an embodiment of the present invention. The light emitting apparatus t includes a structural body 100 which is similar to FIG. 1, which has a conducting wire structure and an encapsulating body. A light emitting structure is disposed in the encapsulating body of the structural body, and electrically coupled with the conducting wire structure. The light emitting device structure is, for example, a solid organic or inorganic LED, and emits light at a first-frequency-range under a suitable driving voltage. The first frequency ranged light is, for example, UV light, blue light, or other light at a frequency which is higher than the generated second frequency ranged light.

It should be noted that the light emitting surface of the LED device structure 105 is covered by a first dielectric layer 120. The first dielectric layer 120 is used to reduce or eliminate total internal reflection or Fresnel reflection loss of the first frequency ranged light at the encapsulating body 122 LED interface. For example, it is a film having a reducing refractivity, or a medium having a density increasing or reducing along with the film depth. The structure and the function of the first dielectric layer 120 are described in detail as follows. Further, a dielectric reflector 118 is disposed on at least part of periphery wall of the encapsulating body, wherein according to practical requirement, the reflector 118 may be disposed on all of periphery walls except for the dielectric layer 120, so as to increase the output light efficiency of the light emitting apparatus. In other words, the present invention uses the dielectric layer 120 on the light emitting device (LED) structure, for example, on the light emitting surface of the LED, so as to reduce or eliminate total internal reflection or Fresnel reflection loss on the light emitting surface, thus increasing the output light efficiency.

In FIG. 2, the encapsulating material 122 is filled into the encapsulating body in the structural body 100. A luminescent material 124 is distributed over the encapsulating body 122. The luminescent material is excited by the first frequency ranged light to generate at least a second-frequency-ranged light, so as to obtain an emitted light output at least including the first-frequency and the second frequency ranged light, or a second frequency ranged monochromatic light.

The color light generation process of LED may be different if the excitation wavelength is different. For example, if green light is required, the first frequency ranged light is, UV or blue light, and the luminescent material 124 is green light luminescent material. Therefore, the luminescent material 124 can be excited by UV light or blue light to generate green light. Furthermore, for example, white light can be generated via UV light excitation of luminescent materials blend made up of red, green and blue luminescent materials 124. Further, for example the luminescent material 124 is yellow light luminescent material, and the first frequency ranged light is blue light, the blue and yellow light are then mixed to form white light. The luminescent material 124 can be luminescent powder, quantum dot, or organic luminescent material. The luminescent materials 124 are widely used in many applications nowadays, so it is not described in detail and is familiar to those of ordinary skill in the art. Moreover, the present invention is not limited to the said luminescent material 124. Certainly, the other color light can be obtained by the light emitting apparatus of the present invention and suitable blend of the red, green and blue luminescent materials 124.

Still referring to FIG. 2, other embodiments are illustrated as examples, for example, the light emitting device structure (also referred to as light emitting source) is adopted to emit higher frequency UV or blue light, and the desired output light is the lower frequency light, such as green light. The UV light is illustrated as an embodiment, if UV light emitted by the light emitting device structure does not completely interact with green light luminescent material 124, part of the UV light is then leaking or absorbed. In order to increase the recycling of UV light or blue light to increase the output light emitting efficiency, for example, a dielectric reflector 126 may be further disposed on the encapsulating body 122. The dielectric reflector is, for example, a multi-layer lamination formed by evaporating or depositing the suitable materials, such as $ZnO_2$, $SiO_2$, $Ta_2O_5$, $Al_2O_3$, $TiO_2$ and polymer.

For the performance of the dielectric reflector 126, according to the feature generated by the multi-layer lamination, the higher frequency light may be totally reflected, and the lower frequency light is allowed to pass through. Therefore, for example the leaking UV light is reflected by the dielectric reflector 126 back to the encapsulating layer 122, so as to continue to excite the luminescent material 124. The required green light can pass through.

Figure 3:
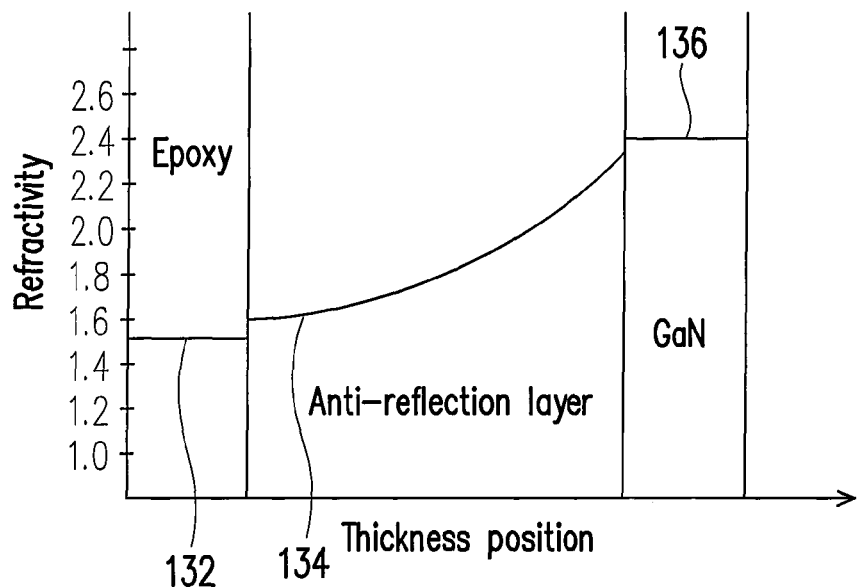
FIG. 3 is the distribution of refractivity from the encapsulating layer, passing through the first dielectric layer to the LED device material structure.
Figure 4:
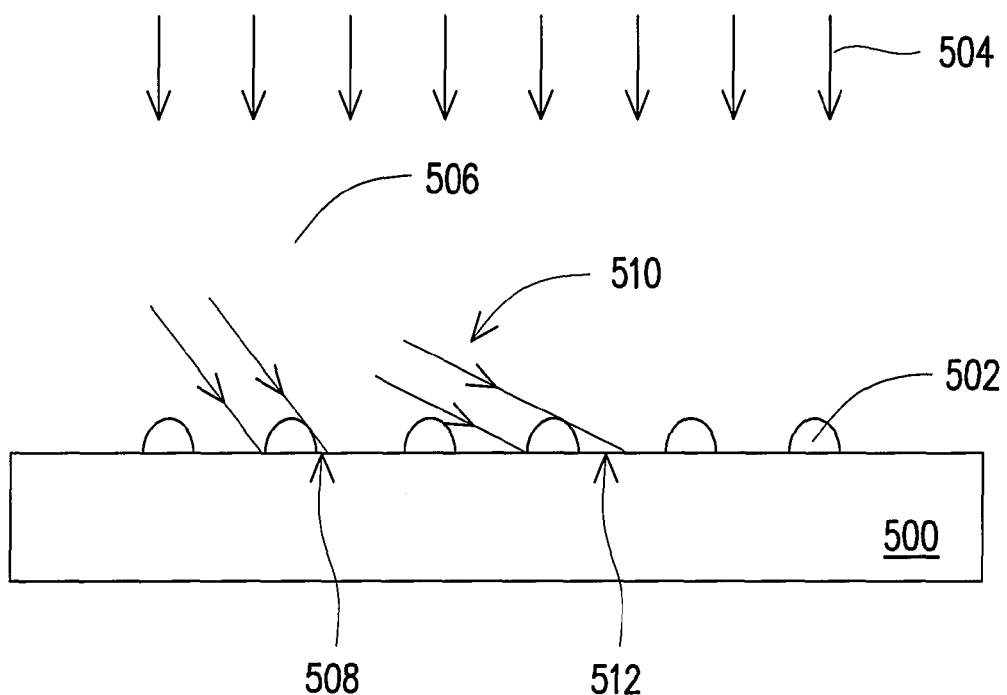
FIG. 4 is a schematic view of fabricating the dielectric layer 120 by an oblique-angle deposition method according to an embodiment of the present invention.

Here, some embodiments are illustrated to describe the function and the fabrication method of the dielectric layer 120 of varying density. FIG. 3 is the distribution of the refractivity from the encapsulating body 122, passing through the first dielectric layer 120 of varying density to the light emitting device material structure, e.g., the semiconductor layer 108 of GaN. The encapsulating layer 122, for example the epoxy, has a low refractivity 132, with n=1.5. The semiconductor layer 108 has a high refractivity 136, with n=2.4. For the conventional method, as shown in FIG. 1, the semiconductor layer 108 directly contacts the encapsulating body 114. According to optics principle, when the incident angle of the emitted light at the interface is larger than the critical angle, the light will suffer total internal reflection (TIR) and is reflected back into LED 105 structure and is absorbed, at the interface between the high refractivity semiconductor layer 108 and low refractivity encapsulating body 114. However, the present invention provides a first dielectric layer 120 disposed on the interface, for example the first dielectric layer 120 is a deposited film with a refractivity 134 decreasing from the refractivity 136 to the refractivity 132, or a single medium having a density decreasing along with the deposition depth. In this manner, the critical angle associated with total internal reflection (TIR) at the interface increase, hence reducing or eliminating the amount of light reflected back to the light emitting structure because of TIR Many methods may be used to fabricate the first dielectric layer of varying film density 120, and the present invention is not limited to the particular method. Only an embodiment is illustrated as an example. FIG. 4 is a schematic view of fabricating the first dielectric layer of varying film density 120 by an oblique-angle deposition method according to an embodiment of the present invention. In this embodiment, for example, the first dielectric layer of varying film density 120 is fabricated via the material of higher refractivity, so that the refractivity of the first dielectric layer 120 is reducing. Referring to FIG. 4, some deposition object 502 exists at the nucleation sites on a substrate 500. When the required same deposition material 504 is deposited in the vertical direction, the deposition object 502 does not result in the shielding effect. Further, for example when the same deposition material 506 is deposited at an oblique-angle, part of deposition object 502 may be blocked, thus a cavity 508 is formed. Because of the cavity 508, the refractivity is reduced. If the deposition material 510 is deposited at a larger oblique-angle, the cavity 512 becomes bigger and the refractivity becomes smaller. The feature of the reducing refractivity is achieved as long as the function of the film density with respect to the depth of the required deposition is controlled. In other words, the film refractivity reduces as deposition film density reduces, for theoretical details, please refer to D. Bergman, "The dielectric constant of a composite material—a problem in classical physics", Physics Reports 43, 377-407, [1978].

However, it should be noted that in the present invention, the method of fabricating the first dielectric layer of varying density 120 is not limited to oblique-angle deposition method, and other methods may also be used. In other words, the present invention provides, for example, the first dielectric layer of varying density 120 disposed between the light emitting device structure and the encapsulating body, such that the light at the first frequency emitted by the light emitting structure enters the low refractivity encapsulating body more efficiently, so as to excite the luminescent material 124 to emit the light at the second frequency range efficiently. The luminescent material 124 is excited to emit light with primary peak emission within the wavelength range of about 625-740 nm, 590-625 nm, 565-590 nm, 500-565 nm, 485-500 nm, 440-485 nm or 380-440 nm, or a combination thereof.

Figure 5:
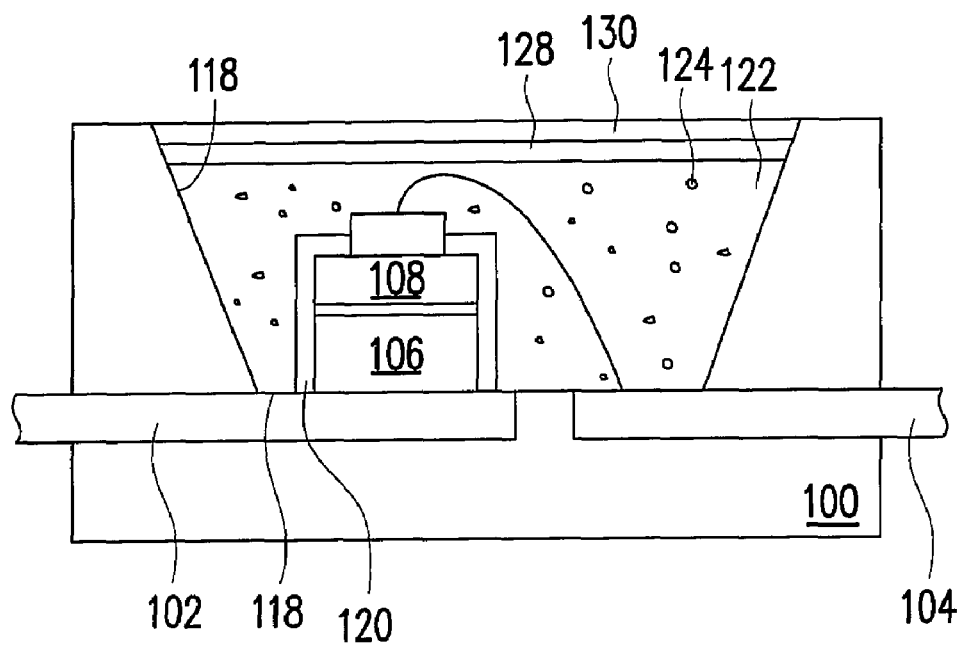
FIG. 5 is a schematic sectional structural view of another light emitting apparatus according to an embodiment of the present invention.

Next, light emitting device usually operates in the air environment. The refractivity of air is lower than that of the encapsulating layer, so for example, a dielectric layer may be further added. FIG. 5 is a schematic cross sectional view of another light emitting device according to the embodiment of the present invention. Referring to FIG. 5, first a dielectric reflector 128 is formed on the encapsulating layer 122, it is, for example, the same as said dielectric reflector 126 of FIG. 2. Next, an additional dielectric layer 130 is disposed between the dielectric reflector 128 and air, it has the same function as that of the dielectric layer 120, but it is used to the refractivity index between the dielectric reflector 128 and air, so as to reduce the generated light back reflection into the encapsulating layer 122 due to total internal reflection and Fresnel loss.

According to the practical design requirement, if the light emitting device structure emits blue light, and the luminescent material 124 is yellow luminescent powder, blue and yellow light are then mixed to obtain white light. Under such design, for example, the dielectric reflector 128 is not that necessarily required on the encapsulating body, and only the dielectric layer 130 is disposed between the encapsulating layer 122 and air.

In the embodiment of the present invention, a dielectric layer 120 is disposed on the interface between the light emitting device structure and the encapsulating layer. The dielectric layer 120 covers the light emitting surface of the light emitting device structure, so as to effectively reduce total internal reflection and Fresnel loss.

The embodiment of the present invention intends to meet the practical design requirement, one of or the combination of the said reflector 128 and said dielectric layer 130 are disposed at the light emitting surface of the encapsulating layer, thus further improving the output light efficiency.

Figure 6:
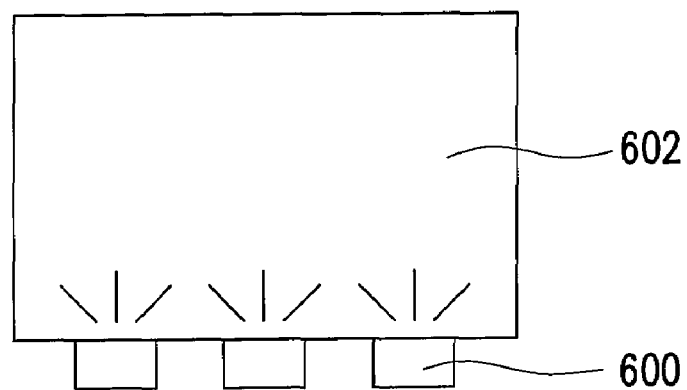
FIG. 6 is a schematic structural view of the planar light source apparatus formed by the light emitting apparatus according to an embodiment of the present invention.

According to the light emitting apparatus of the present invention, the present invention provides a planar light emitting source apparatus. FIG. 6 is a schematic cross sectional view of the planar light emitting source apparatus formed by the light emitting apparatus according to an embodiment of the present invention. The planar light emitting source apparatus includes at least one light guide plate 602 and a plurality of light emitting apparatus 600 as described in the embodiment. The light emitting apparatus 600 are disposed at the peripheral of the light guide plate 602, the back surface of the light guide plate 602 is reflective, and so the said planar light emitting source apparatus emits light from front surface of the light guide plate.

Figure 7:
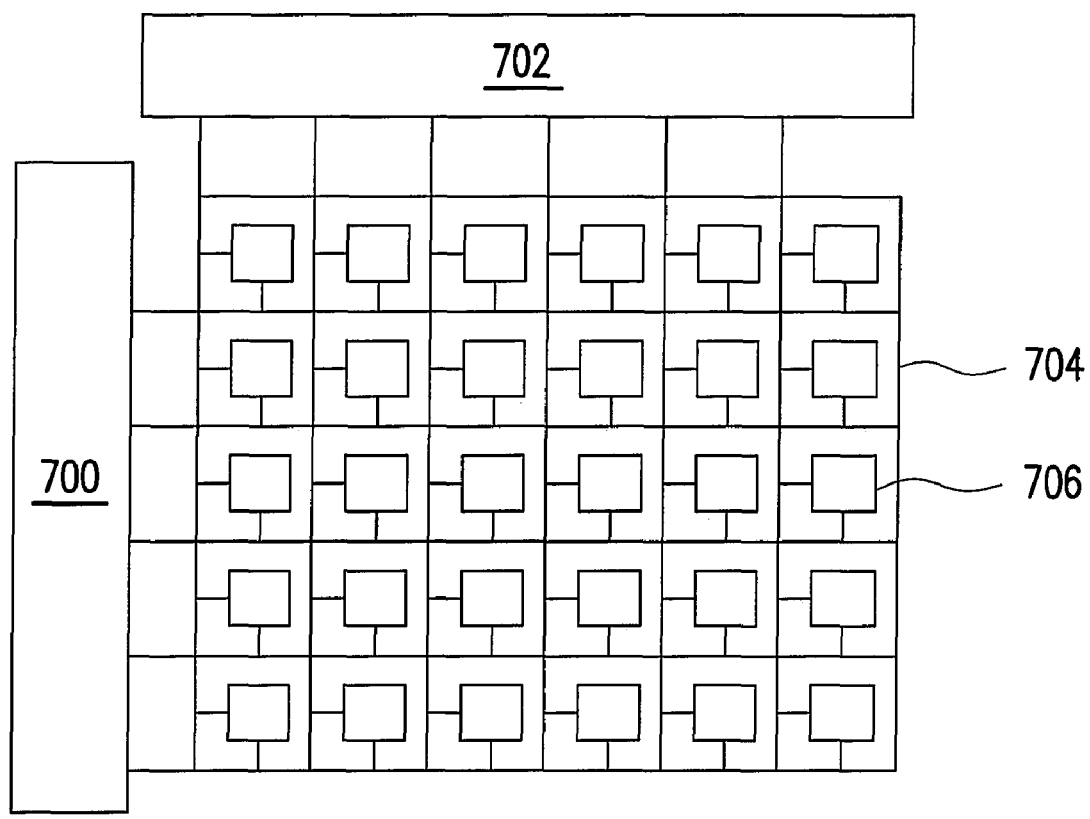
FIG. 7 is a schematic structural view of the flat panel display apparatus formed by the light emitting apparatus according to an embodiment of the present invention.

Further, the present invention provides a planar display apparatus. FIG. 7 is a schematic cross sectional view of the planar display formed by the light emitting apparatus according to an embodiment of the present invention. At least one light emitting apparatus 706 forms a spatial array arrangement 704. Electrical driving circuits 700, 702 are used to drive the light emitting apparatus 706 to emit visible light to distribute on the light emitting surface of the said display apparatus according to input signals.

It is apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting apparatus, at least comprising:
   a light emitting device;
   a conducting wire structure;
   an encapsulating body, wherein the light emitting device is positioned inside the encapsulating body, electrically coupled with the conducting wire structure, and thus emits a light at a first frequency range under a suitable driving voltage;
   a first dielectric layer, covering a light emitting surface of the light emitting device and highly transmitting the light at the first frequency range, wherein the light emitting device includes a semiconductor layer having a first index of refraction, the encapsulating body has a second index of refraction higher than the first index of refraction, and the first dielectric layer has a third index of refraction that bridges a difference between the first index and the second index of refraction;
   a packaging material, filling into the encapsulating body, wherein the packaging material at least comprises one luminescent material, which can be excited by the first frequency range light to generate at least a second frequency range light; and
   a reflector, disposed on a light emitting surface of the encapsulating body, reflecting the first frequency range light back to the encapsulating body omni-directionally, wherein the excited second frequency range light can pass through the reflector, and the first frequency range light excites the luminescent material inside of the encapsulating body, thus resulting in light emission at least at a first, and a second frequency, or a single light emission at a second frequency range from the apparatus.

2. The light emitting apparatus of claim 1, wherein the first frequency range light is UV light or blue light.

3. The light emitting apparatus of claim 1, wherein the first and second frequency range lights are mixed and the mixed light is visible.

4. The light emitting apparatus of claim 1, wherein the first dielectric layer is a film having a reducing refractivity, or a medium having a density increasing or decreasing along with the depth.

5. The light emitting apparatus of claim 1, wherein the light emitting device is selected from the group consists of light emitting diodes (LEDs), organic LEDs (OLEDs), lasers, resonant cavity LEDs (RCLEDs), superluminescent LEDs (SLEDs), and a combination thereof.

6. The light emitting apparatus of claim 1, wherein the luminescent material inside the encapsulating body can be excited to emit a primary light within the following wavelength ranges of about 625-740 nm, 590-625 nm, 565-590 nm, 500-565 nm, 485-500 nm, 440-485 nm or 380-440 nm, or any one of the peak ranges, or a combination of at least two ranges thereof.

7. The light emitting apparatus of claim 1, comprising a second dielectric layer capable of transmitting a mixture of the first and second frequency range lights, being disposed on the reflector, so as to reduce total internal reflection and Fresnel loss at the light emitting interface.

8. The light emitting apparatus of claim 1, wherein the first dielectric layer is on the light emitting surface to reduce or eliminate a total internal reflection or a reflection loss on the light emitting surface.

9. The light emitting apparatus of claim 1, wherein the reflector omni-directionally reflects the first frequency range light, but allows the second frequency range light to pass.

10. The light emitting apparatus of claim 9, further comprising a second reflector, located on an inner peripheral surface of the encapsulating body, reflecting at least a light at the first frequency and the second frequency ranges.

11. A planar light emitting source apparatus, comprising:
    at least one light guide plate; and
    a plurality of light emitting apparatus of claim 1, wherein the light emitting apparatus are disposed at a periphery of the light guide plate, and the back surface of the light guide plate is reflective, so that the light is emitted from the front surface of the light guide plate.

12. The planar light emitting source apparatus of claim 11, wherein the first dielectric layer is on the light emitting surface to reduce or eliminate a total internal reflection or a reflection loss on the light emitting surface.

13. A planar display, comprising:
    at least a light emitting apparatus array, wherein light emitting apparatus of claim 1 are spatially arranged in a two dimensional array and a driving electrical circuit to drive the light emitting apparatus to emit visible light, wherein visible light distributes over the light emitting surface of the display according to input signals.

14. The planar display of claim 13, wherein the first dielectric layer is on the light emitting surface to reduce or eliminate a total internal reflection or a reflection loss on the light emitting surface.

15. The light emitting apparatus of claim 1, wherein the luminescent material in the encapsulating body is luminescent powder, quantum dot, or organic luminescent material.

16. The light emitting apparatus of claim 15, wherein the luminescent material is luminescent powder and such powder is at least one of luminescent powders emitting red, green, and blue light respectively.

17. The light emitting apparatus of claim 15, wherein the luminescent material is a luminescent dot, and such quantum dot is at least one of quantum dots emitting red, green, and blue light respectively.

18. The light emitting apparatus of claim 15, wherein the luminescent material is an organic luminescent material, and such organic luminescent material is at least one of organic luminescent materials emitting red, green, and blue light respectively.

* * * * *